United States Patent
Choi et al.

(10) Patent No.: US 6,483,747 B2
(45) Date of Patent: Nov. 19, 2002

(54) METHOD FOR PROTECTING AN OVER-ERASURE OF REDUNDANT MEMORY CELLS DURING TEST FOR HIGH-DENSITY NONVOLATILE MEMORY SEMICONDUCTOR DEVICES

(75) Inventors: Ki-Hwan Choi, Seoul; Jong-Min Park, Suwon, both of (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 10/138,002

(22) Filed: May 3, 2002

(65) Prior Publication Data

US 2002/0126554 A1 Sep. 12, 2002

Related U.S. Application Data (60) Division of application No. 09/533,306, filed on Mar. 23, 2000, now Pat. No. 6,407,944, which is a continuation-in-part of application No. 09/222,035, filed on Dec. 31, 1998, now abandoned.

(51) Int. Cl.$^7$ .......................... G11C 16/04; G11C 16/06
(52) U.S. Cl. .............................. 365/185.09; 365/185.11
(58) Field of Search ...................... 365/185.09, 185.11, 365/185.17, 185.29, 185.3, 185.33

(56) References Cited

U.S. PATENT DOCUMENTS

| | | | |
|---|---|---|---|
| 4,794,568 A | 12/1988 | Lim et al. .................. 365/200 |
| 5,237,535 A | 8/1993 | Mielke et al. ............... 365/200 |
| 5,418,752 A * | 5/1995 | Harari et al. ........... 365/185.11 |
| 5,461,587 A | 10/1995 | Oh .............................. 365/200 |
| 5,548,555 A | 8/1996 | Lee et al. ..................... 365/200 |
| 5,602,778 A | 2/1997 | Futatsuya et al. ....... 365/185.09 |
| 5,671,178 A | 9/1997 | Park et al. ............. 365/185.09 |
| 5,748,543 A | 5/1998 | Lee et al. .................... 365/200 |
| 5,774,396 A | 6/1998 | Lee et al. .............. 365/185.09 |
| 5,848,009 A | 12/1998 | Lee et al. .................... 365/200 |
| 5,995,422 A | 11/1999 | Im et al. ..................... 365/200 |
| 6,122,194 A * | 9/2000 | Chung et al. .......... 365/185.09 |
| 6,219,280 B1 * | 4/2001 | Naganawa ............. 365/185.11 |
| 6,249,461 B1 * | 6/2001 | Choi et al. ............. 365/185.33 |
| 6,349,057 B2 * | 2/2002 | Hotaka .................. 365/185.09 |
| 6,351,412 B1 * | 2/2002 | Nozoe et al. .......... 365/185.09 |

* cited by examiner

Primary Examiner—Trong Phan
(74) Attorney, Agent, or Firm—Marger Johnson & McCollom, P.C.

(57) ABSTRACT

A method is disclosed for preventing over-erasure in a nonvolatile memory device having a plurality of sectors, each sector including a main field and a redundant field. The method includes the steps of programming memory cells included in the main and redundant fields, erasing the memory cells included in the main and redundant fields, and programming over-erased cells of the memory cells included in the main and redundant fields. The main and redundant fields are included in a sector.

5 Claims, 8 Drawing Sheets

| Ar | A3 | A2 | A1 | A0 | YAi/YRk | YBj | MCTLn (n=0~15) |
|---|---|---|---|---|---|---|---|
| 0 | 0 | 0 | 0 | 0 | YA0 | YB0 | Inactive |
| 0 | 0 | 0 | 0 | 1 | YA1 | YB0 | Inactive |
| 0 | 0 | 0 | 1 | 0 | YA2 | YB0 | Inactive |
| 0 | 0 | 0 | 1 | 1 | YA3 | YB0 | Inactive |
| 0 | 0 | 1 | 0 | 0 | YA4 | YB0 | Inactive |
| 0 | 0 | 1 | 0 | 1 | YA5 | YB0 | Inactive |
| 0 | 0 | 1 | 1 | 0 | YA6 | YB0 | Inactive |
| 0 | 0 | 1 | 1 | 1 | YA7 | YB0 | Inactive |
| 0 | 1 | 0 | 0 | 0 | YA0 | YB1 | Inactive |
| 0 | 1 | 0 | 0 | 1 | YA1 | YB1 | Inactive |
| 0 | 1 | 0 | 1 | 0 | YA2 | YB1 | Inactive |
| 0 | 1 | 0 | 1 | 1 | YA3 | YB1 | Inactive |
| 0 | 1 | 1 | 0 | 0 | YA4 | YB1 | Inactive |
| 0 | 1 | 1 | 0 | 1 | YA5 | YB1 | Inactive |
| 0 | 1 | 1 | 1 | 0 | YA6 | YB1 | Inactive |
| 0 | 1 | 1 | 1 | 1 | YA7 | YB1 | Inactive |
| 1 | 0 | 1 | 1 | 0 | YR0 | YB0 | Active |
| 1 | 0 | 1 | 1 | 1 | YR1 | YB0 | Active |
| 1 | 1 | 0 | 0 | 0 | YR0 | YB1 | Active |
| 1 | 1 | 0 | 0 | 1 | YR1 | YB1 | Active |

Fig. 7

| Ar | A3 | A2 | A1 | A0 | YAi/YRk | YBj | MCTLn (n=0~15) |
|---|---|---|---|---|---|---|---|
| 0 | 0 | 0 | 0 | 0 | YR0 | YB0 | Active |
| 0 | 0 | 0 | 0 | 1 | YA1 | YB0 | Inactive |
| 0 | 0 | 0 | 1 | 0 | YA2 | YB0 | Inactive |
| 0 | 0 | 0 | 1 | 1 | YR1 | YB0 | Active |
| 0 | 0 | 1 | 0 | 0 | YA4 | YB0 | Inactive |
| 0 | 0 | 1 | 0 | 1 | YA5 | YB0 | Inactive |
| 0 | 0 | 1 | 1 | 0 | YA6 | YB0 | Inactive |
| 0 | 0 | 1 | 1 | 1 | YA7 | YB0 | Inactive |
| 0 | 1 | 0 | 0 | 0 | YA0 | YB1 | Inactive |
| 0 | 1 | 0 | 0 | 1 | YA1 | YB1 | Inactive |
| 0 | 1 | 0 | 1 | 0 | YA2 | YB1 | Inactive |
| 0 | 1 | 0 | 1 | 1 | YA3 | YB1 | Inactive |
| 0 | 1 | 1 | 0 | 0 | YR0 | YB1 | Active |
| 0 | 1 | 1 | 0 | 1 | YA5 | YB1 | Inactive |
| 0 | 1 | 1 | 1 | 0 | YA6 | YB1 | Inactive |
| 0 | 1 | 1 | 1 | 1 | YA7 | YB1 | Inactive |
| 1 | 0 | 1 | 1 | 0 | YR0 | YB0 | Active |
| 1 | 0 | 1 | 1 | 1 | YR1 | YB0 | Active |
| 1 | 1 | 0 | 0 | 0 | YR0 | YB1 | Active |
| 1 | 1 | 0 | 0 | 1 | YR1 | YB1 | Active |

METHOD FOR PROTECTING AN OVER-ERASURE OF REDUNDANT MEMORY CELLS DURING TEST FOR HIGH-DENSITY NONVOLATILE MEMORY SEMICONDUCTOR DEVICES

This application is a divisional of U.S. patent application Ser. No. 09/533,306, filed on Mar. 23, 2000, now U.S. Pat. No. 6,407,944, which is a continuation-in-port of U.S. patent application Ser. No. 09/222,035, filed on Dec. 31, 1998, now is abandoned.

This application incorporates by reference an application for Method For Protecting An Over-erasure Of Redundant Memory Cells During Test For High-density Nonvolatile Memory Semiconductor Devices earlier filed in Korean Industrial Property Office on the Dec. 31, 1997 and there duly assigned Ser. No. 97-81001.

FIELD OF THE INVENTION

The invention relates to nonvolatile semiconductor memory devices, and more particularly to a method for preventing over-erasure of redundant memory cells of nonvolatile semiconductor memories during test thereof.

BACKGROUND OF THE INVENTION

Flash memories perform data access operations, i.e., reading and writing (or programming) at high speed as compared to other kinds of nonvolatile memories such as electrically erasable and programmable read only memories. Because of its high speed operation, flash memory has been adapted to portable computing devices, cellular phones, digital still cameras, and so on.

Figure 1:
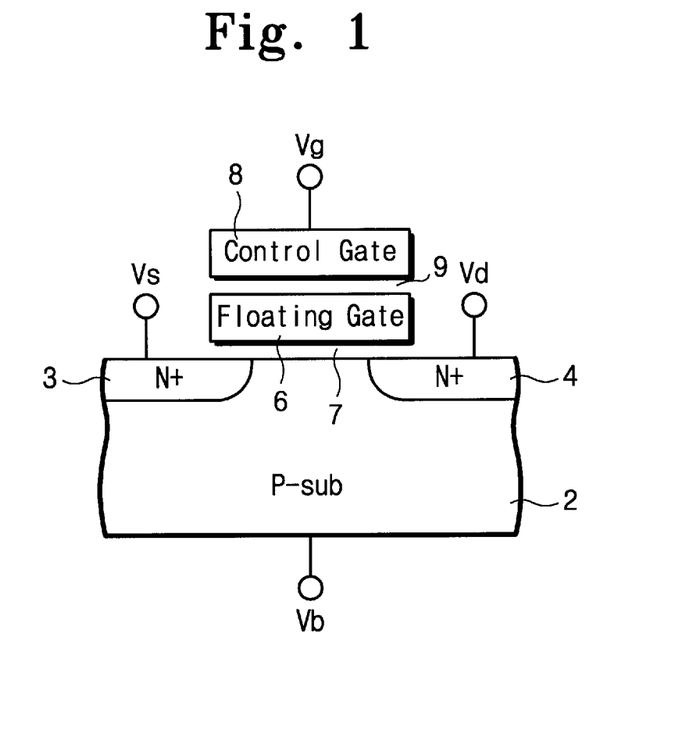
FIG. 1 shows a vertical structure of a flash electrically erasable and programmable memory cell.

Typical construction of a flash memory cell (or cell transistor) appropriate for either single-bit or multi-bit storage is shown in FIG. 1. Source 3 and drain 4, each being formed of an N+ diffused region in a P+ semiconductor substrate or bulk 2, are separated from each other by a channel region (not numbered) in bulk 2. Floating gate 6 is formed over the channel region, and separated from it by a thin (e.g., less than 100 Å thick) insulating film 7. A second insulating film 9, such as an O—N—O (Oxide-Nitride-Oxide) film, is formed on floating gate 6 to isolate control gate 8 from floating gate 6. Source 3, drain 4, control gate 8, and bulk 2 are each connected to their corresponding voltage sources Vs (source voltage), Vd (drain voltage), Vg (gate voltage) and Vb (bulk voltage), for programming, erasing, and reading operations.

Figure 2:
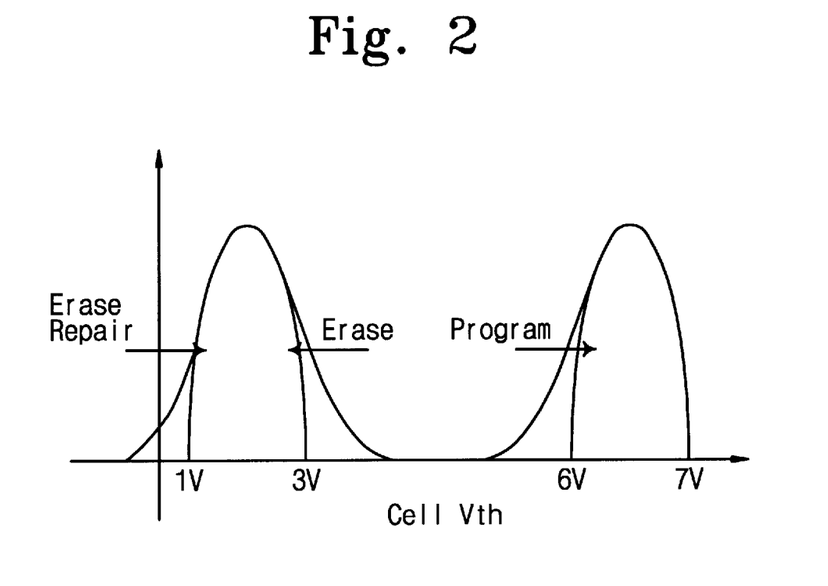
FIG. 2 shows distribution profiles of memory cells after programming and erasing.

A selected memory cell is programmed by means of hot electron injection between its channel region and its floating gate. During a programming operation, source and bulk are held at a ground voltage, a high voltage (e.g., 10V) is applied to a control gate, and a hot electron injection voltage (e.g., 5–6V) is provided to drain. After programming, a selected memory cell has an increased threshold voltage (e.g., to 6–7V) due to the deposition of electrons in the floating gate, as shown in FIG. 2.

To read data from the programmed cell, a voltage of about 1V is applied to the drain, a power source voltage (e.g., about 4.5V) is applied to the control gate, and the source is held at the ground voltage. Since the increased threshold voltage of a programmed memory cell acts as a blocking potential against the gate voltage during a read-out operation, a programmed cell remains off during the read operation, while an erased cell turns on.

A memory cell is erased either by inducing F-N (Fowler-Nordheim) tunneling between its control gate and its source (hereinafter, this manner is referred to as a "source erasing") or by inducing F-N tunneling between its control gate and its bulk (hereinafter, this manner is referred to as a "bulk erasing").

In erase operations for most state-of-the-art flash memories, source regions (for source erasing) or bulk regions (for bulk erasing) of multiple memory cells are combined commonly, so that the memory cells can be spontaneously erased at the same time. The units of erasing (hereinafter referred to as a "sector", for instance, one sector of, e.g., 16, 32, or 64 Kbytes) are determined in accordance with the number of separate source or bulk regions.

During such an erase operation of a memory cell, the control gate is coupled to a high negative voltage of about −10V, and source (for source erasing) or bulk (for source erasing) is held at a positive voltage of about 5V in order to induce tunneling therebetween. At the same time, drain and bulk (for source erasing), or drain and source (for bulk erasing) are conditioned at a high impedance state (or a floating state). Under these voltage bias conditions, a strong electric field is induced between the control gate and either the source or the bulk, and the electric field causes electrons to move from the floating gate into the source or the bulk. F-N tunneling normally occurs when an electric field in the range of 6–7 MV/cm is developed in the thin insulating film separating the floating gate and the source or bulk. An erased cell has a lower threshold voltage (e.g., 1–3V) than a programmed cell (e.g., 6–7 V), as shown in FIG. 2, and is thereby sensed as an on-cell.

Generally, since source erasing creates a smaller coupling capacitance between channel and floating gate than bulk erasing does, the source erasing brings about fewer over-erased cells. The source erasing, however, not only consumes larger power than the bulk erasing but also causes faster deterioration of tunnel oxide, on account of band-to-band tunneling current and a larger number of hot electrons in sources. In addition, a cell in a source erasing architecture occupies a larger area than a cell in a bulk erasing architecture because the cell for source erasing needs an additional N-region for its source. Furthermore, as a cell for the source erasing has an F-N tunneling area smaller than the bulk erasing with advancement of cell scaling-down, the source erasing may have a drawback of causing a decrease in the uniformity of threshold voltage distribution. Accordingly, the bulk erasing architecture is suitable for high-density devices, rather than the source erasing architecture.

Meanwhile, a cell array of a flash memory device is typically divided into a main field for storing data and a redundant field for repairing defects in the main field. The redundant field contains multiple spare memory cells arranged to repair defective cells of the main field due to hard defects or soft defects. The spare cells are substituted for the defective memory cells, so that a defective device can develop into a non-defective one as a whole. A usual manner for repairing cell defects is determined by the architecture of the core region (typically, defect repair uses row redundancy or column redundancy).

After wafer manufacturing processes, a flash memory device requires a test procedure (including programming, program-verifying, erasing, and erase-verifying operations) to identify whether the device has defects. During such a test, a flash memory device is tested by programming main-field cells, in sequence, and then erasing them by applying negative voltages to their word lines. And, such programming and erasing cycles for device test are performed repeatedly.

With repetitive erasing for device test, one or more cells may be erased below a minimum acceptable threshold voltage (e.g., 1V), as shown in FIG. 2. A cell erased below the minimum threshold is commonly referred to as being "over-erased". An over-erased cell acts "depletion-like" and induces a leakage current on its associated bit-line, thereby causing errors when other cells on the same bit-line are read.

Accordingly, over-erased cells need erasure correction to raise their thresholds by about 1V. One solution for this is to perform an iterative process utilizing over-erase verification and low-voltage level programming.

For instance, an operation for curing over-erase cells of a flash memory device with a column redundant architecture, during such a device test, can begin with selecting a row (i.e., a word-line) and examining cells on the selected row one by one along columns (i.e., bit-lines) to determine whether there are over-erased cells. This procedure is commonly referred to as over-erase verification. In this verify operation, a cell is identified as over-erased when it conducts current in excess of the current expected at the lowest threshold voltage (e.g., 1V). Once a cell is identified as over-erased, it is programmed with low-level curing voltages (e.g., 2–5 V to the control gate, 6–9 V to the drain, and 0 V to the source and bulk). Curing the remaining cells on other rows is performed in the same fashion.

When some main-field cells within a sector become over-erased with repetitive erasing for device test, then redundant-field cells of the sector may also become over-erased because sources (for source erasing) or bulks (for bulk erasing) of the main- and redundant-field cells of the sector are connected to a common voltage (e.g., 5V). In this case, however, it may not be possible to cure the over-erased redundant-field cells because of the conventional redundancy scheme, in which the redundant-field cells cannot be addressed until they are substituted for the failed main-field cells by means of, for example, a laser fusing or electrical fusing technique. When redundant-field cells are too much over-erased without any correction, they will be unavailable for repairing failed cells of the main field. Nevertheless, the redundant field over-erasure correction is not presently at issue in the art because almost all of conventional flash memories adopt source erasing scheme that causes relatively small extent of cell over-erasure, or because the cells of the memories are large enough not to consider over-erasure problem of the redundant field. And furthermore, the bulk erasing architecture may be essential for increasing flash memory capacity, notwithstanding its over-erasure flaw.

Based on the above and foregoing, it can be appreciated that the over-erasure of redundant field cannot be overlooked any longer upon designing advanced higher-density devices; since the number of factors to affect cell characteristics increases with the decrease in cell size, the number of erasing operations to check defective cells will increase more and more with device density, so that the redundant field over-erasure problem will turn more serious in view of device production yields.

SUMMARY OF THE INVENTION

The present invention is intended to solve the problems described above. And, it is an object of the invention to provide a method for preventing a redundant field from being over-erased when the redundant field is erased together with a main field during device test before repair of failed cells.

According to an aspect of the present invention, a method for protecting against over-erasure in a nonvolatile memory device with bulk erasing architecture is provided, which includes programming memory cells included in a redundant field of a selected memory cell sector, and testing the memory device for repair of failed cells in a main field of the sector by erasing memory cells included in the main field.

According to another aspect of the invention, a method for testing a nonvolatile memory device before repair of failed cells in the memory device is disclosed, which includes erasing memory cells included in a main field and a redundant field of a selected sector, and correcting over-erased memory cells included in the main and redundant fields of the selected sector.

According to yet another aspect of the invention, a method of testing a nonvolatile memory device prior to repair of failed cells is provided, that includes the steps of programming memory cells included in the main and redundant fields of a sector, erasing the memory cells included in the main and redundant fields, and programming over-erased cells of the memory cells included in the main and redundant fields.

In a more specific embodiment, the method includes the steps of programming memory cells included in the main and redundant fields, applying a predetermined negative voltage to the word lines of the main field and the redundant field and applying a predetermined voltage to bulk regions of the main and redundant fields, detecting over-erased memory cells in the main and redundant fields, and programming the over-erased memory cells included in the main field and the redundant field.

According to yet another aspect of the invention, a nonvolatile memory device is provided that comprises a plurality of sectors each of which includes a main field of memory cells and a redundant field of memory cells, an over-erase detection circuit which detects over-erased memory cells in both a main field and a redundant field of a sector during device test before repair of failed cells in the memory device, and an over-erase correction circuit which performs over-erasure correction for the detected over-erased cells in both the main and redundant fields before the repair of the failed memory cells.

In an embodiment, the memory device comprises an address generator for generating addresses to program the memory cells in both the main and redundant fields before repair of failed memory cells in the main and redundant fields, a flag generator for generating flag signals in response to the addresses, and a data path selector for providing selective connections between a plurality of data input/output lines and the memory cells in the main and redundant fields in response to the flag signals.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote the same or corresponding parts.

DETAILED DESCRIPTION OF THE PREFERRED EMBODIMENTS

Figure 3:
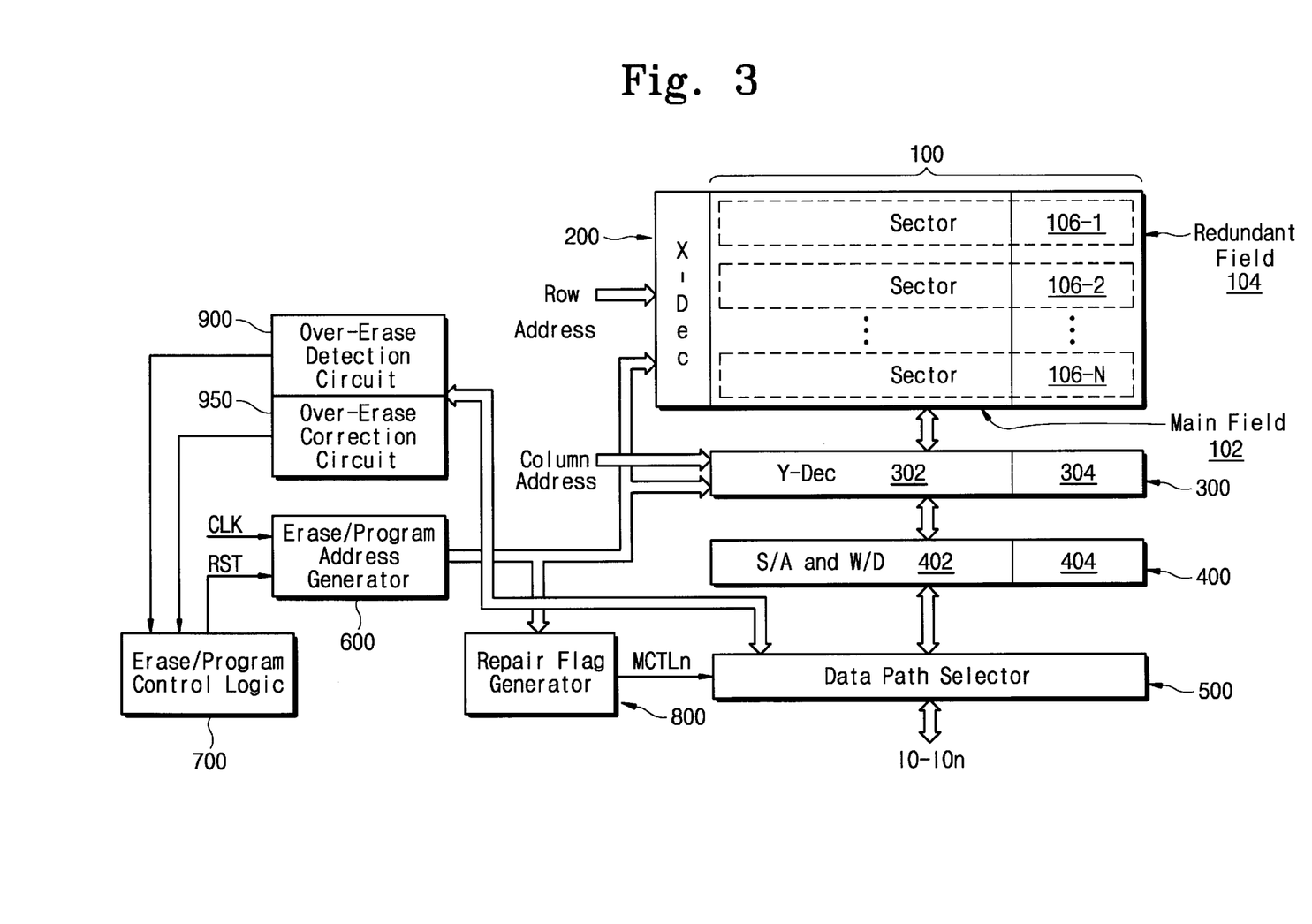
FIG. 3 shows an embodiment of a flash memory device according to the present invention.

FIG. 3 shows an embodiment of a flash memory device of the present invention. The flash memory device includes an array of memory cells 100 consisting of a main field 102 for data storage and a redundant field 104 for repair of defects of the main field 102. The main and redundant fields 102 and 104 are each divided into a plurality of subfields. A subfield of main field 102 and a corresponding subfield of redundant field 104 are included in a common sector.

The flash memory device also includes a row (or X) decoder 200 for decoding row addresses, a column (or Y) decoder 300 for decoding column addresses, and a sense amplifier and write driver 400 for sensing or writing data from or to the memory cell array 100. A circuit section 302 of column decoder 300 and a subsection 402 of the sense amp and write driver 400 correspond to main field 102, whereas the other subsections 304 and 404 of column decoder 300 and the sense amp and write driver 400 correspond to the redundant field 104. For convenience of explanation, the circuits 302 and 304 are referred to as main and redundant column decoders, respectively.

The flash memory device further includes a data path selector 500, an erase/program address generator 600, an erase/program control circuit 700, and a repair flag generator 800. The data path selector 500 provides selective connections between input/output lines (IO0–IOn) and memory cells in the main field and/or the redundant field in response to flag signals MCTLn from the repair flag generator 800. Erase/program address generator 600 generates addresses for erase/program operations under control of the erase/program control logic circuit 700. Repair flag generator 800 provides the flag signals MCTLn to control the data path selector 500, based on I/O information, indicating which column(s) corresponding to the erase/program address has defects, and an erase/program address.

Also shown in FIG. 3, the flash memory device includes an over-erase detection circuit 900 and an over-erase correction circuit 950. The over-erase detection circuit detects over-erased memory cells in both a main field and a redundant field of a sector during device test before repair of failed cells in the memory device, together with the above-described circuits 500–800. The over-erase correction circuit performs over-erasure correction for the detected over-erased cells in both the main and redundant fields before the repair of the failed memory cells, together with the circuits 500–800.

Figure 4:
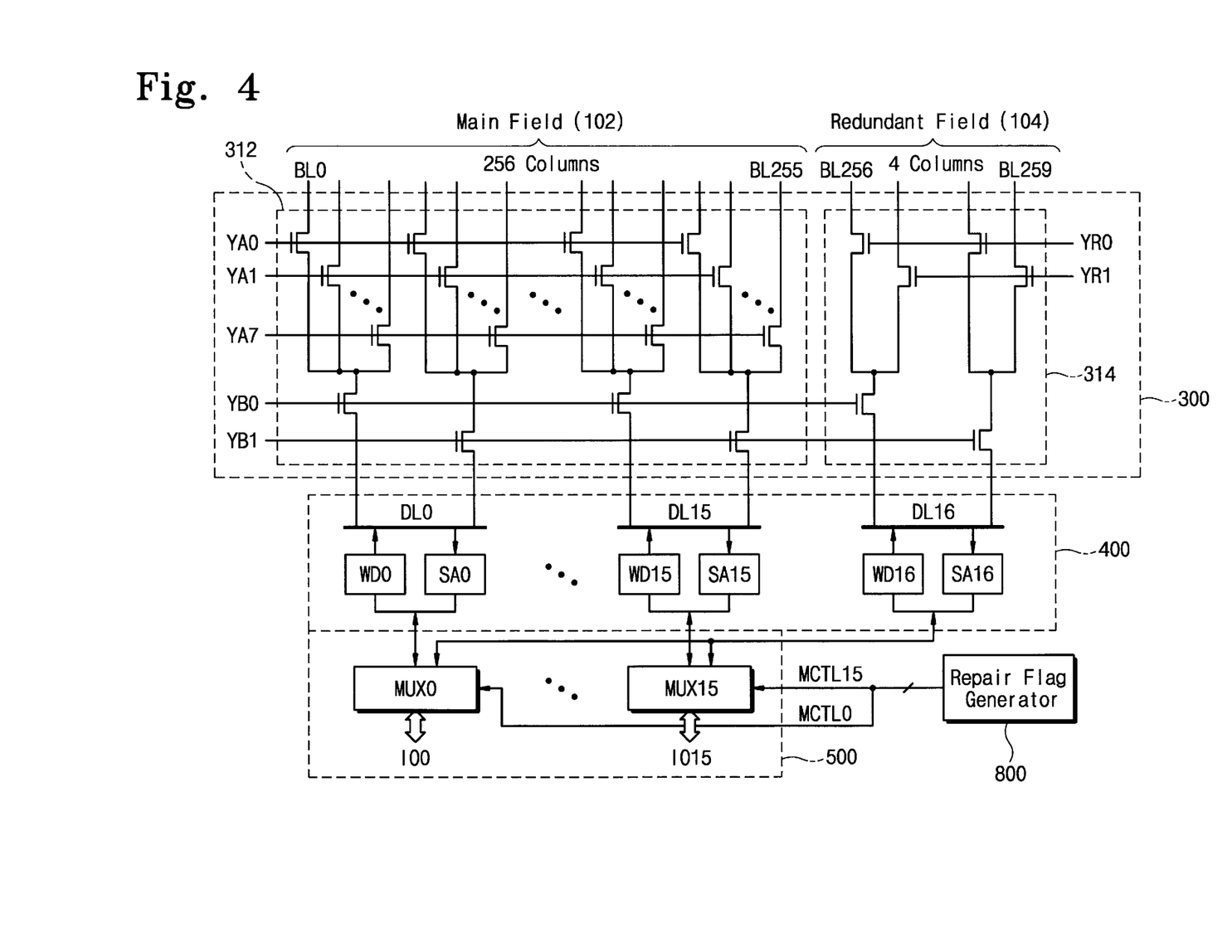
FIG. 4 is a detailed circuit diagram of the Y-decoder, the sense amplifier and write driver, and the data path selector, shown in FIG. 3.

FIG. 4 shows examples of the column decoder 300, the sense amp and write driver 400, and the data path selector 500, shown in FIG. 3. With reference to FIG. 4, main field 102 has 256 columns (or main bit lines BL0–BL255), and redundant field 104 has 4 columns (or redundant bit lines BL256–BL259). Main column decoder 302 contains a main Y-pass gate circuit 312 that has plural NMOS transistors to connect main field 102 to main data lines DL0–DL15. Redundant column decoder 304 contains a redundant Y-pass gate circuit 314 that has plural NMOS transistors to connect redundant field 104 to a redundant data line DL16.

Main and redundant Y-pass gate circuits 312 and 314 respond to gating signals YA0–YA7, YB0, YB1, YR0 and YR1 from an address decoding logic circuit (not shown) within the column decoder 300. Write drivers WD0–WD15 (for main field) and WD16 (for redundant field), and sense amplifiers SA0–SA15 (for main field) and SA16 (for redundant field) are arranged between data lines DL0–DL16 and data path selector 500. Data path selector 500 includes 16 multiplexers MUX0–MUX15 corresponding to 16 data I/O lines IO0–IO15, respectively. Each of the multiplexers MUX0–MUX15 responds to a corresponding one of flag signals MCTL0–MCTL15 from repair flag generator 800.

Flag signals MCTL0, MCTL1, . . . , and/or MCTL15 are activated by, for example, cutting fuses (not shown) corresponding to an address designating failed memory cells in the main field 102. Also, activation of the flag signal(s) depends upon information as to which columns (including I/O lines and bit lines) have defects. If a memory cell assigned to a first column BL0 of the main field is failed, I/O information about the defective column BL0 would be stored in repair flag generator 800 and the defective column BL0 would be substituted with, for instance, a first column BL256 of the redundant field 104. The I/O information about defective columns is reflected in generation of flag signals MCTL0–MCTL15.

Defective-cell repair techniques associated with flash memory devices are more fully described in, for example, U.S. Pat. Nos. 4,794,568; 5,461,587; 5, 548,555; 5,671,178; 5,748,543; 5,848,009; and 5,995,422, assigned to the present assignee, the disclosures of which are hereby incorporated herein by reference as if fully set forth herein.

Figure 5:
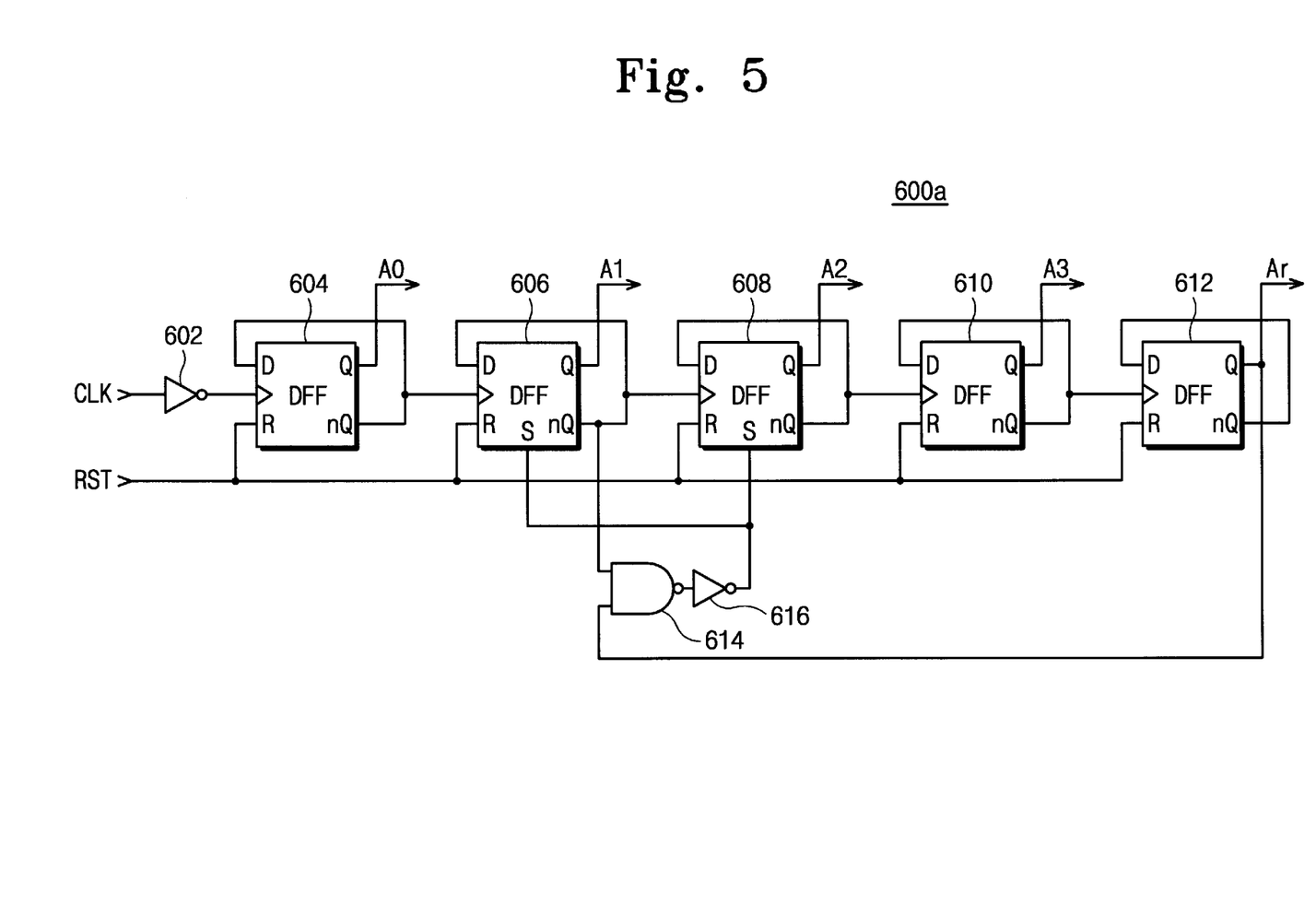
FIG. 5 is an example of the erase/program address generator shown in FIG. 3.

FIG. 5 shows an example 600a of the erase/program address generator 600 according to the present invention. Referring to FIG. 5, address generating circuit 600a comprises an asynchronous 5-bit binary counter, which is configured with inverter gates 602 and 616, edge-triggered D flip-flops 604–612 coupled in serial, and a NAND logic gate 614. An input of inverter gate 602 is supplied with a clock signal CLK which is internally generated during cell programming operations of a flash memory device. One period of the clock signal CLK equals one cycle time of an erase or program operation. An output of inverter logic gate 602 is connected to a clock input of D flip-flop 604.

A positive output Q of D flip-flop 604 provides an address signal A0. A negative output nQ of the D flip-flop 604 is connected to a clock input of next D flip-flop 606 and is also fed back to a data input D of the flip-flop 604. Flip-flops 606, 608, 610, and 612 have their outputs Q to present address signals A1, A2, A3, and Ar. Each flip-flop 606, 608, or 610 has its negative output nQ coupled to a clock input of its next flip-flop 608, 610, or 612. Negative output nQ of each flip-flop 606, 608, or 610 is also fed back to its data input D.

Flip-flops 604–612 toggle on leading edges (Low-to-High transitions) of their clock inputs. Reset inputs R of the flip-flops 604–612 commonly receive a reset signal RST from erase/program control logic 700 (see FIG. 3). NAND logic gate 614 receives a negative output nQ of flip-flop 606 (i.e., an inversed signal $\overline{A1}$ of address signal A1) and address signal Ar at its two inputs. An output of NAND logic gate 614 is applied to an input of inverter gate 616. An output of inverter gate 616 is commonly provided to set inputs S of flip-flops 606 and 608. In this example, the NAND logic gate 614 and the inverter gate 616 can be replaced with an AND logic gate.

Figure 6:
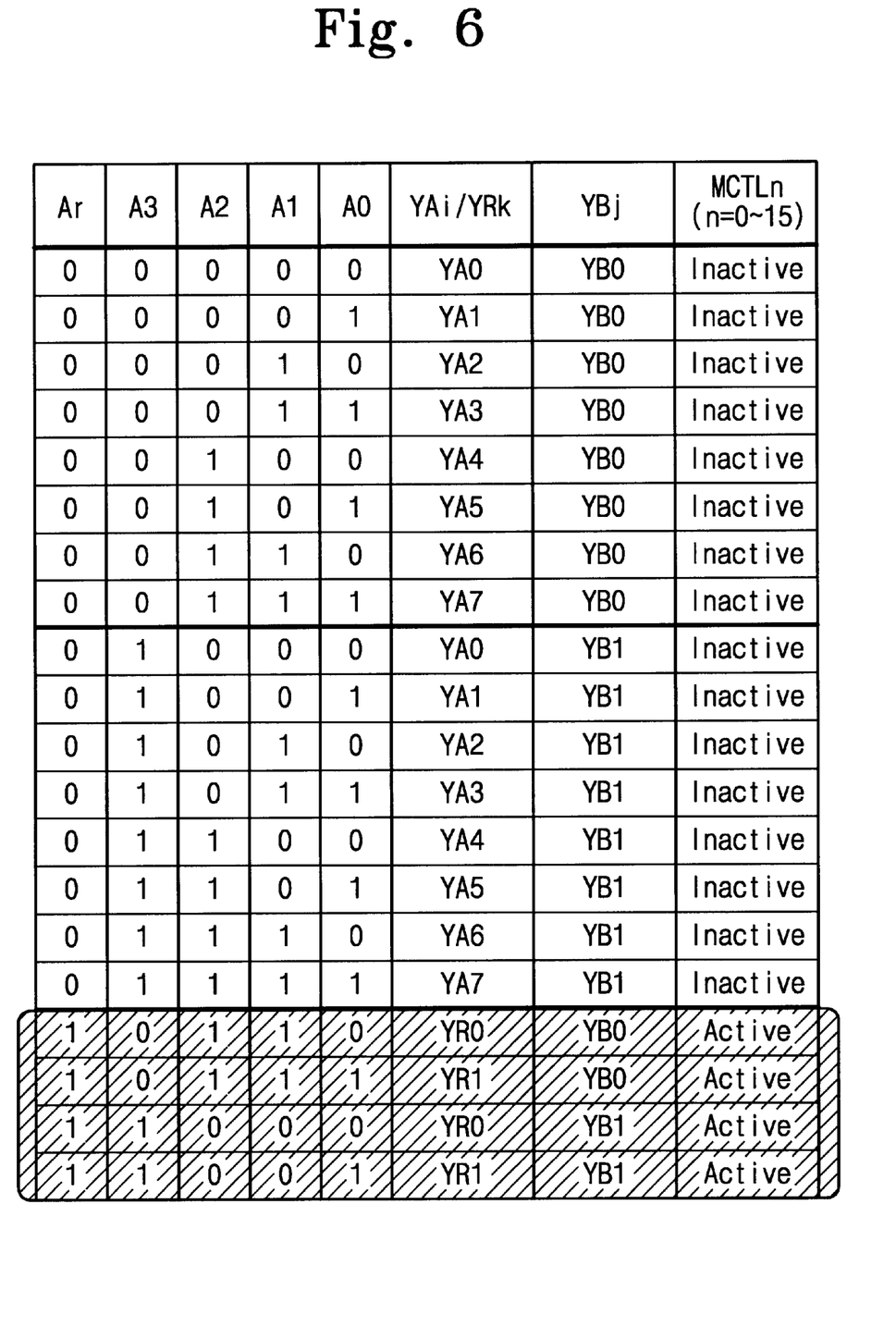
FIG. 6 shows an example of column program address coding before cell repair according to the present invention.

FIG. 6 shows an example of column program address coding before cell repair, utilizing the address generating circuit 600a and the repair flag generator 800.

Referring to FIG. 6, address signal Ar determines field addressing of memory cell array 100. Address Ar of a logic zero ('0') represents main-field addressing for program operations, while address Ar of a logic one ('1') represents redundant-field addressing for program operations. The redundant field 104 can be addressed for programming by the address Ar even before repair of defective cells in main field 102.

During main-field addressing, all of flag signals MCTL0–MCTL15 become inactive so lines DL0–DL15 through corresponding write drivers WD0–WD15, respectively. But, only one predetermined flag signal (e.g., MCTL0) preferably becomes active during redundant-field addressing, and so one I/O line (e.g., IO0) is electrically coupled to redundant data line DL16 via corresponding write driver WD16.

Activation of gating signals YA0–YA7 for main Y-pass gate circuit 312 depends upon address signals A0–A2 from address generating circuit 600a. For example, when all of address signals A0–A2 are logic zeros, gating signal YA0 becomes active or high.

Address signal A3 determines gating signal YB0 and YB1 for the Y-pass gate circuit 312. When A3 is a logic zero then YB0 becomes active, while YB1 becomes active when A3 is a logic one.

Gating signal YR0 and YR1 for redundant Y-pass gate circuit 314 are determined by the least significant bit (LSB) address signal A0 of address generating circuit 600a. Gating signal YR0 becomes active when A0 is a logic zero, whereas gating signal YR1 becomes active when A0 is a logic one.

As described above, the address coding scheme of the invention provides programming over-erased cells included in the redundant field before repair of failed cells in main field so as to prevent redundant-field cells from being too over-erased to repair failed cells of main field.

Figure 7:
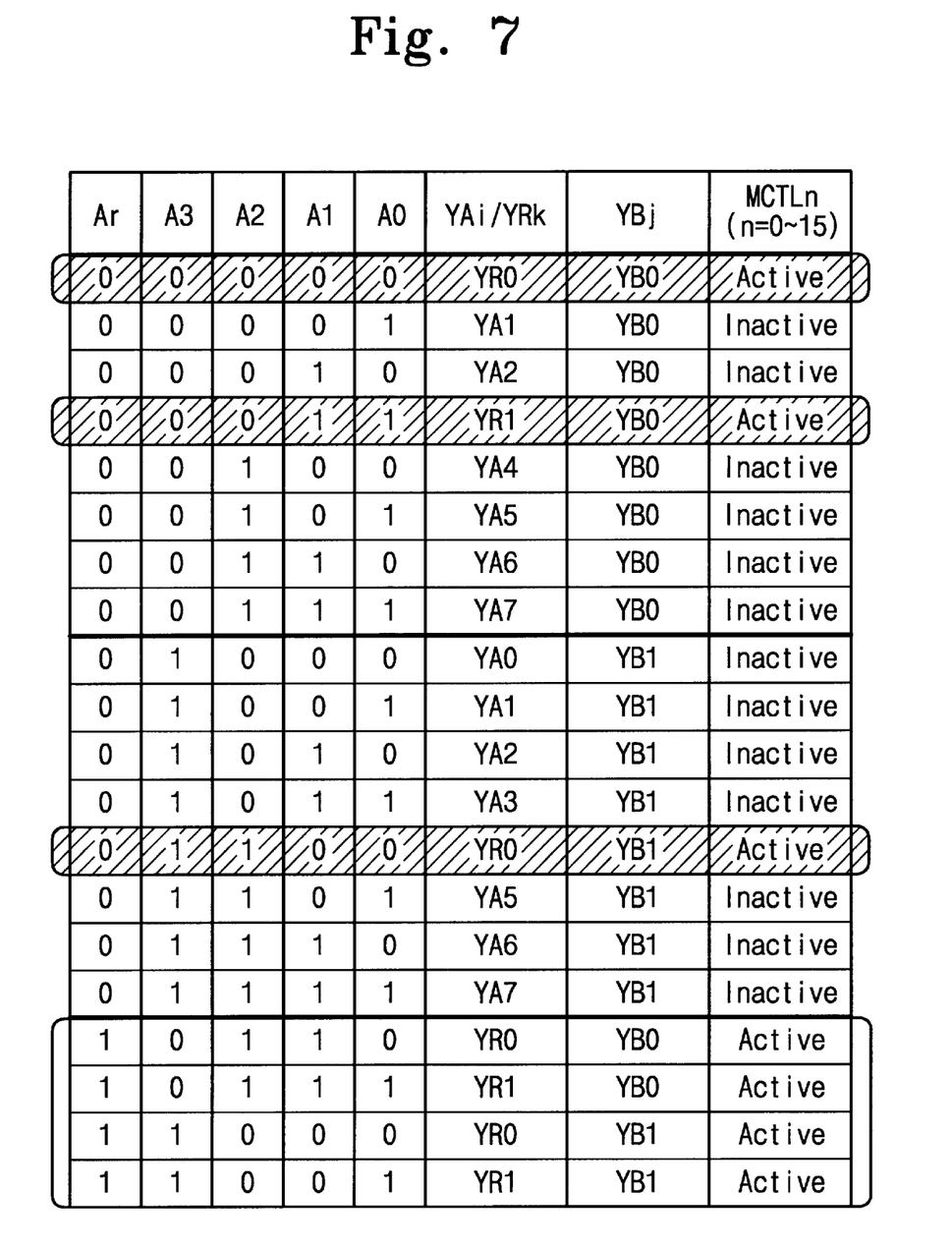
FIG. 7 shows an example of column program address coding after cell repair according to the present invention.

FIG. 7 shows an example of column program address coding after cell repair, utilizing the address generating circuit 600a and the repair flag generator 800. For explanation, it is assumed here that main field 102 has three columns containing defective cells. Hatched rows of address coding table, in FIG. 7, represent defective main-field columns which are substituted with three redundant-field columns (e.g., BL256–BL258 shown in FIG. 4) by using a defective cell repair technique.

After cell repair, when a 5-bit column address A0–Ar is '00000', gating signals YR0 and YB0 become active, as shown in FIG. 7. In this embodiment, a 5-bit address A0–Ar (e.g., '00000') corresponds to 16 columns (e.g., BL0, BL8, BL16, ..., BL248) as shown in FIG. 4. Thus, in this case, an appropriate one of flag signal MCTL0–MCTL15 corresponding 16 I/O lines IO0–IO15 becomes selectively active. For example, if column BL0 has defects, flag signal MCTL0 becomes active. But, if column BL248 is failed, then flag signal MCTL15 becomes active.

Address A0–Ar of '11000' renders active gating signals YR1 and YB0, and one flag signal, and address A0–Ar of '00110' makes active gating signals YR0 and YB1, and one flag signal.

In FIG. 7, states of the other signals are determined in the same manner as the address coding shown in FIG. 6. Thus, the explanation therefor will be omitted to avoid duplicate description.

Figure 8:
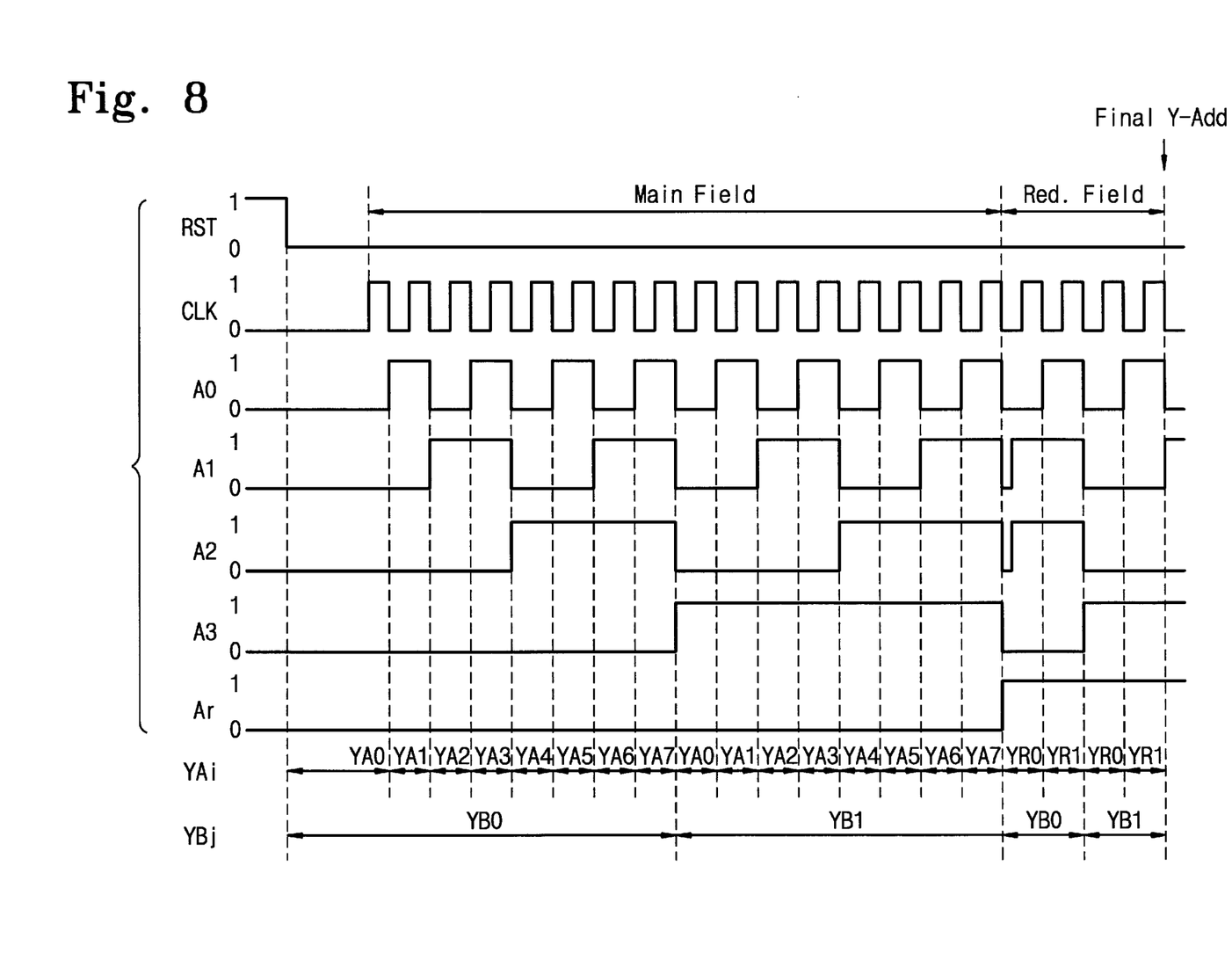
FIG. 8 is a timing diagram of the erase/program address generator of FIG. 5.

FIG. 8 shows operational timing of the address generating circuit 600a, shown in FIG. 5, before defective memory cells in the main field 102 are substituted with cells in the redundant field 104, namely, before repairing defective cells in the main field 102.

With reference to FIGS. 5, 6 and 8, address generating circuit 600a begins to count up program addresses at a trailing edge (High-to-Low transition) of clock signal CLK after reset signal RST from erase/program control logic 700 (see FIG. 3) becomes inactive (Low).

Flip-flop 604 toggles on a leading edge (Low-to-High transition) of an output of inverter gate 602. Flip-flops 606–612 each toggle on leading edges of negative outputs nQ of their preceding flip-flops 604–610.

Addressing for main field 102 starts at address (A0–Ar) of '00000'. Addresses for the main field are counted up sequentially. During this period, an output of inverter logic 616 remains inactive (or Low) since address Ar is 0 (or Low).

After the address changes from '11110' to '00001', redundant-field addressing begins. When the address is '00001', $\overline{A1}$ and Ar both are logic ones. Thus, flip-flops 606 and 608 are set by NAND logic gate 614 and inverter gate 616. As a result of this, redundant-field addressing practically starts at address (A0–Ar) of '01101'. Address generating circuit 600a continues to count addresses of '11101', '00011', and '10011' in this sequence.

Erase/program address generator 600 allows programming over-erased cells included in redundant field before repair of failed cells in main field. Thus, its is possible to protect redundant-field cells from over-erasure. In this example, the redundant field is programmed after completion of programming main field, but it can be understood by those skilled in the art that redundant field programming may precede by main field programming.

Figure 9:
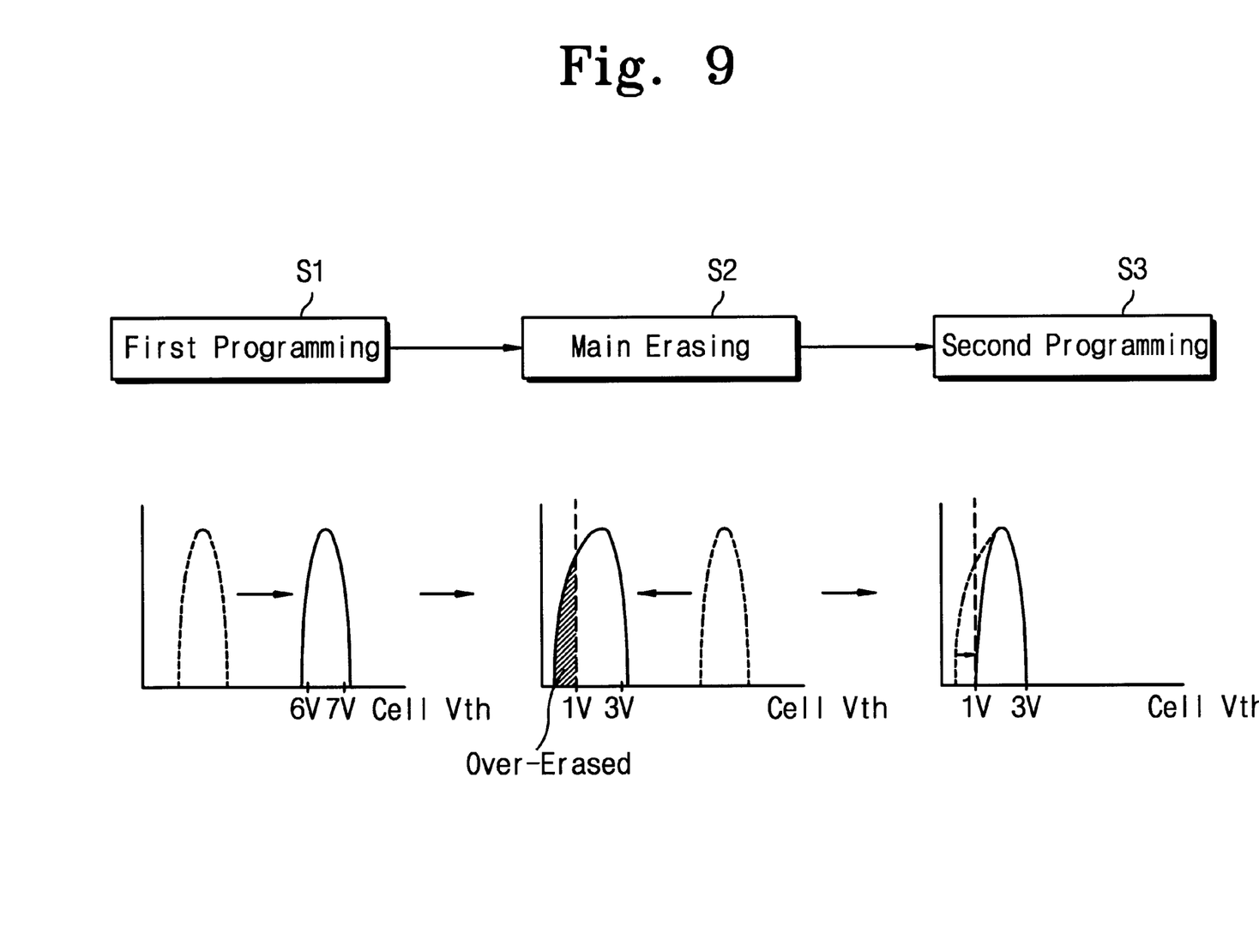
FIG. 9 shows a flow diagram for erasing memory cells according to the invention.

FIG. 9 shows steps in an embodiment of the invention, aligned with a corresponding flow of the threshold voltage distribution for redundant memory cells during program and erasure operations for device test. It should be noted that the steps S1 through S3 are applied to the redundant field 104 as well as to the main field 102.

At step S1 (the first programming operation), all memory cells (of the main and redundant fields) in a sector are programmed in order to condition the sector for an erasure operation. By programming, threshold voltages of the programmed memory cells are positioned at a level of 6–7V. Next, at step S2 (the main erasure operation), a predetermined negative voltage (e.g., –10V) is applied to word lines of the sector and thereby the threshold voltages of the memory cells are lowered to 1–3V. After the main erasure operation, the second programming operation S3 is performed for over-erased memory cells, thereby shifting the threshold voltages of the over-erased cells (those with thresholds under 1V) to a level higher than 1V.

The programming in the redundant field 104 is performed on each of the columns in the redundant field. And, after step S2, preferably, a verifying operation is carried out to detect the over-erased cells in the main and redundant fields 102 and 104.

In another embodiment of the invention, device test may be performed with only two steps S1 and S2. At step S1, the redundant field is programmed enough to protect an over-erasure during the next step S2 for erasing the main field. At step S1, the main field may be programmed along with the redundant field.

In another embodiment of the invention, device test may be performed with steps S2 and S3. After erasure of the main field at step S2, over-erased cells included in the redundant field may be corrected as well as over-erased cells in the main field at step S3.

As described above, since the three or two steps of a first programming, main erasing and a second programming are conducted in the redundant field as well as in the main field, over-erased cells in the redundant field can be avoided and a reliable redundant operation can be secured thereby.

From the disclosed and described embodiments, it will be appreciated that other embodiments and modifications within the scope of the invention are possible.

What is claimed is:

1. A nonvolatile memory device comprising:
   an array of memory cells which is divided into a main field and a redundant field, the main and redundant fields being included in a common sector;
   an address generator for generating addresses to program the memory cells in both the main and redundant fields before repair of failed memory cells in the main and redundant fields;
   a flag generator for generating flag signals in response to the addresses; and
   a data path selector for providing selective connections between a plurality of data input/output lines and the memory cells in the main and redundant fields in response to the flag signals.

2. The memory device of claim 1, wherein the memory cells in the main and redundant fields have bulk regions connected in common.

3. The memory device of claim 1, wherein the redundant field is programmed after completion of programming the main field.

4. The memory device of claim 1, wherein the redundant field is programmed before the main field.

5. The memory device of claim 1, said address generator comprising:
   an inverter gate which receives a clock signal;
   a plurality of flip-flops, coupled in serial, for generating a program address for programming the main field or the redundant field in response to an output of the inverter gate, the flip-flops being reset by a control signal; and
   a logic circuit for setting at least one of the flip-flops in response to the program address so as to select the redundant field before the repair of the failed memory cells.

* * * * *

UNITED STATES PATENT AND TRADEMARK OFFICE
CERTIFICATE OF CORRECTION

PATENT NO.   : 6,483,747 B2
DATED        : November 19, 2002
INVENTOR(S)  : Choi et al.

It is certified that error appears in the above-identified patent and that said Letters Patent is hereby corrected as shown below:

Column 7,
Line 13, "become inactive so lines" should read -- become inactive so that data path selector 500 allows I/O lines IO0-IO15 to be electrically coupled with main data lines --.

Signed and Sealed this

Twenty-second Day of April, 2003

JAMES E. ROGAN
*Director of the United States Patent and Trademark Office*